US007915860B2

(12) United States Patent
Quint et al.

(10) Patent No.: US 7,915,860 B2
(45) Date of Patent: Mar. 29, 2011

(54) BATTERY MANAGEMENT SYSTEM WITH RUNTIME RESERVE ANALYSIS

(75) Inventors: Jonathan B. Quint, Newton, MA (US); Steven H. Dworkin, Newton, MA (US)

(73) Assignee: BatteryCorp, Inc., Newton, MA (US)

( * ) Notice: Subject to any disclaimer, the term of this patent is extended or adjusted under 35 U.S.C. 154(b) by 514 days.

(21) Appl. No.: 11/980,312

(22) Filed: Oct. 30, 2007

(65) Prior Publication Data
US 2009/0281928 A1  Nov. 12, 2009

Related U.S. Application Data

(63) Continuation-in-part of application No. 11/491,807, filed on Jul. 24, 2006, now abandoned, which is a continuation-in-part of application No. 11/125,450, filed on May 10, 2005, now Pat. No. 7,616,002, which is a continuation-in-part of application No. 11/125,631, filed on May 10, 2005, now Pat. No. 7,349,816, which is a continuation-in-part of application No. 11/025,816, filed on Dec. 29, 2004, now Pat. No. 7,317,995, which is a continuation-in-part of application No. 11/025,305, filed on Dec. 29, 2004, now Pat. No. 7,206,704, which is a continuation-in-part of application No. 10/749,004, filed on Dec. 30, 2003, now Pat. No. 7,003,431.

(51) Int. Cl.
*H02J 7/00*  (2006.01)
*G01N 27/416*  (2006.01)
*G01R 31/36*  (2006.01)

(52) U.S. Cl. ........ 320/132; 320/106; 324/426; 324/435; 702/63

(58) Field of Classification Search .................. 320/132; 702/63
See application file for complete search history.

(56) References Cited

U.S. PATENT DOCUMENTS

| | | | |
|---|---|---|---|
| 3,935,531 A | 1/1976 | Slomcenski | 324/72 |
| 4,222,665 A | 9/1980 | Tachizawa et al. | 356/218 |
| 5,140,269 A | 8/1992 | Champlin | 324/433 |
| 5,250,904 A | 10/1993 | Salander et al. | 324/430 |
| 5,545,967 A | 8/1996 | Osborne et al. | 320/2 |
| 5,615,129 A * | 3/1997 | Stich et al. | 700/297 |
| 5,661,463 A | 8/1997 | Letchak et al. | 340/636.15 |
| 5,744,962 A | 4/1998 | Alber et al. | 324/426 |
| 5,751,217 A | 5/1998 | Kchao et al. | 340/636.16 |
| 6,051,976 A | 4/2000 | Bertness | 324/426 |
| 6,160,382 A | 12/2000 | Yoon et al. | 320/136 |
| 6,265,884 B1 | 7/2001 | Menashi et al. | 324/717 |
| 6,339,334 B1 | 1/2002 | Park et al. | 324/425 |
| 6,353,800 B1 | 3/2002 | Rector | 702/63 |
| 6,392,414 B2 | 5/2002 | Bertness | 324/429 |
| 6,456,036 B1 | 9/2002 | Thandiwe | 320/106 |
| 6,765,388 B1 | 7/2004 | Clegg | 324/426 |
| 6,829,562 B2 * | 12/2004 | Sarfert | 702/182 |
| 6,967,890 B2 | 11/2005 | Shen | 365/226 |

(Continued)

*Primary Examiner* — Edward Tso
*Assistant Examiner* — Yalkew Fantu
(74) *Attorney, Agent, or Firm* — Peter S. Canelias

(57) ABSTRACT

The invention relates to the management of large stationary batteries. The invention is a comprehensive system and process for the management of stationary batteries that are used for backup power and are deployed in widely dispersed locations. The system may be comprised of a plurality of batteries and web-based software. The system software can automatically analyze, determine and report the number of batteries and total cost based on required runtime reserve by computing the power of batteries currently in a system and available batteries for installation.

11 Claims, 6 Drawing Sheets

U.S. PATENT DOCUMENTS

| | | | |
|---|---|---|---|
| 7,003,431 B2 * | 2/2006 | Quint et al. | 702/183 |
| 2001/0035756 A1 | 11/2001 | Kozlowski | 324/426 |
| 2002/0047711 A1 | 4/2002 | Bertness et al. | 324/426 |
| 2002/0120906 A1 | 8/2002 | Xia et al. | 716/2 |
| 2002/0180445 A1 | 12/2002 | Bertness et al. | 324/426 |
| 2002/0196025 A1 | 12/2002 | Freeman et al. | 324/426 |
| 2003/0020478 A1 | 1/2003 | Scott | 324/426 |
| 2004/0085072 A1 | 5/2004 | Kanou et al. | 324/426 |
| 2004/0128089 A1 | 7/2004 | Barsoukov et al. | 702/65 |
| 2004/0220775 A1 | 11/2004 | Schuh | 702/185 |
| 2004/0251907 A1 | 12/2004 | Kalley | 324/426 |
| 2005/0001627 A1 | 1/2005 | Anbuky et al. | 324/427 |
| 2005/0071093 A1 | 3/2005 | Stefan | 702/60 |
| 2005/0234663 A1 * | 10/2005 | Quint et al. | 702/63 |

* cited by examiner

YOUR Company Name HERE

Runtime Replacement Forecast
Demo Company 3 - Telecom
Required Runtime Reserve: 4 Hours

| Site Name | Manufacturer | Part Number | Quantity | Price Each | Battery Cost | Extra Strings | Labor Cost | Total Cost |
|---|---|---|---|---|---|---|---|---|
| ME0020 | GNB Industrial Battery Corp. | 100A25 | 12 | $1.00 | $12.00 | 0 | $1,000.00 | $1,012.00 |
| ME0046 | GNB Industrial Battery Corp. | 100A25 | 12 | $1.00 | $12.00 | 1 | $0.00 | $12.00 |
| ME0048 | EnerSys Inc. | DDV85-25 | 36 | $1.00 | $36.00 | 3 | $0.00 | $36.00 |
| *ME0050 | GNB Industrial Battery Corp | 100A25 | 0 | $0.00 | $0.00 | 0 | $0.00 | $0.00 |
| *ME0058 | GNB Industrial Battery Corp. | 100A25 | 0 | $0.00 | $0.00 | 0 | $0.00 | $0.00 |
| *ME0062 | GNB Industrial Battery Corp | 100A25 | 0 | $0.00 | $0.00 | 0 | $0.00 | $0.00 |
| ME0066 | GNB Industrial Battery Corp | 100A25 | 1 | $1.00 — $1.00 | | 1 | $0.00 | $1.00 |
| *ME0072 | GNB Industrial Battery Corp | 100A25 | 0 | $0.00 | $0.00 | 0 | $0.00 | $0.00 |
| ME0082 | GNB Industrial Battery Corp | 100A25 | 12 | $1.00 | $12.00 | 1 | $0.00 | $12.00 |

FIG. 5

YOUR CompanyName HERE

Runtime Replacement Forecast

Demo Company 3 - Telecom
Required Runtime Reserve: 4 Hours

| Batteries required to meet specification | | | | |
|---|---|---|---|---|
| Manufacturer | Part No. | Quantity | Cost Each | Extended Amount |
| EnerSys Inc. | DDV85-25 | 36 | 1 | 36 |
| GNB Industrial Battery Corp. | 100A25 | 37 | 1 | 37 |
| | Subtotal | 73 | | $1,000 |
| Labor Estimate | | (5 Locations) | | $1,073 |
| Total Cost | | | | |

*4 Locations cannot meet the requirement in their existing battery configuration

FIG. 6

BATTERY MANAGEMENT SYSTEM WITH RUNTIME RESERVE ANALYSIS

CROSS REFERENCE TO RELATED APPLICATIONS

This application is a continuation-in-part of, and claims priority to U.S. application Ser. No. 11/491,807, filed Jul. 24, 2006, now abandoned related to Ser. No. 11/125,450, filed May 10, 2005, now U.S. Pat. No. 7,616,002 related to U.S. application Ser. No. 11/125,631, filed May 10, 2005, now U.S. Pat. No. 7,349,816 related to U.S. application Ser. No. 11/025,816, filed Dec. 29, 2004, now U.S. Pat. No. 7,317,995 related to U.S. application Ser. No. 11/025,305, filed Dec. 29, 2004 (now U.S. Pat. No. 7,206,704, issued Apr. 17, 2007), each of the foregoing applications being continuations-in-part of U.S. application Ser. No. 10/749,004, filed Dec. 30, 2003 (now U.S. Pat. No. 7,003,431, issued Feb. 21, 2006), and all of the foregoing being incorporated herein by reference in their entirety.

BACKGROUND OF THE INVENTION

The invention relates to the management of large stationary batteries, and incorporates a method of predictive battery failure analysis to enable users to more accurately estimate the useful life of a battery or series of batteries. The invention is preferably employed within a comprehensive system and apparatus for the management of stationary batteries that are used for backup power and are deployed in widely dispersed locations.

Stationary industrial batteries of the type that benefit from the invention are typically sealed lead-acid batteries. These electromechanical devices typically must be installed within 6-10 months from date of manufacture or else they need to be recharged. In addition, most of these batteries are designed for a 10 year useful life, but in the field generally last only from 2-6 years. The discrepancy between design life and actual life is a major problem for users of these batteries. Predicting their useful lifespan to help manage servicing schedules, replacement cost and budgeting for uninterrupted power service is an important and complex task.

In general, batteries are deployed in strings or units of two or four 12-volt jars; in strings of three 12-volt jars; or in strings of six or twelve 2-volt jars, in order to power 24 volt, 36 volt or 48 volt equipment. Other string configurations are also possible. This electrical combination of batteries compounds the difficulty of managing these storage devices. In sum, managing stationary batteries is difficult, and is generally not a core competency of most businesses that use these batteries.

In order to have visibility into the state of health of a stationary battery plant, it is necessary to periodically test the batteries. Upon testing, gross failure of the batteries is apparent, as would be an impending failure within a short time horizon, such as a week or two. These short-term indicia of impending battery failure do not allow planning and budgeting to replace critical power assets.

In many cases, even where the batteries are in good condition there may be a deficiency of backup power due to changes in load requirements. This situation occurs frequently in many industries. For example, in a wireless telecommunications application, a battery backup plant might initially provide four hours of runtime; yet over time as additional communications gear is added to the transmission location, the batteries have to power a greater load and therefore provide less runtime. (Note that "runtime" refers to the length of time that the backup system can provide adequate power to keep the primary equipment operational.)

Prior methods of predicting battery failure are limited to predicting an imminent failure by monitoring a battery jar. For example, U.S. Pat. No. 5,250,904 to Salander et al. provides a prediction of imminent battery failure by means of monitoring a slight change in voltage across the cell or battery terminals, while it is in "float" service, i.e., neither charging or discharging under use. Again, such a short horizon of impending battery failure does not allow planning and budgeting to replace critical power assets.

BRIEF SUMMARY OF THE INVENTION

The present system solves many of these problems. The invention may be described as comprising: a battery unit having a unique identifier; inputted test data on the battery unit associated with the unique identifier within a software system; a communication interface with a computer network; a database for storing battery-related data associated with the unique identifier transmitted over a computer network, the battery-related data comprising an ohmic test value, a baseline ohmic value, and a specified time for determining runtime reserve. The system employs software for generating a runtime reserve report from the battery-related data. These elements work together to providing a means to managing a system of batteries.

Other objects and advantages will be more fully apparent from the following disclosure and appended claims.

BRIEF DESCRIPTION OF THE DRAWINGS

The above-mentioned and other features and objects of this invention and the manner of obtaining them will become apparent and the invention itself will be best understood by reference to the following description of an embodiment of the invention taken in conjunction with the accompanying drawings, wherein:

FIG. 5 is a detailed version of a sample runtime reserve report;

FIG. 6 is a summary version of a sample runtime reserve report.

DETAILED DESCRIPTION

The invention improves way battery systems are managed. Battery management generally comprises a set of tasks. Some of those tasks include testing, maintenance, installation, fulfillment and disposal. The invention is capable of performing these tasks even over a wide geographical area. The main components include a battery or series of batteries; a testing device; and a reporting platform.

In accordance with the purposes of the invention, the battery or series of batteries may be lead-acid having a unique identifier and equipped with technology to enable automated tracking and runtime analysis. A unique identifier may be embodied as a bar coded label, or a virtual identifier (usually a series of alpha-numeric characters). The unique identifier is associated with attributes of the battery. Preferably, the attributes associated with the unique identifier include an ohmic test value and other power properties, such as voltage, maximum charge, and life. The unique identifier may also be in the form of a virtual identification, usually alphanumeric characters that are not embodied in a physical label.

Figure 1:
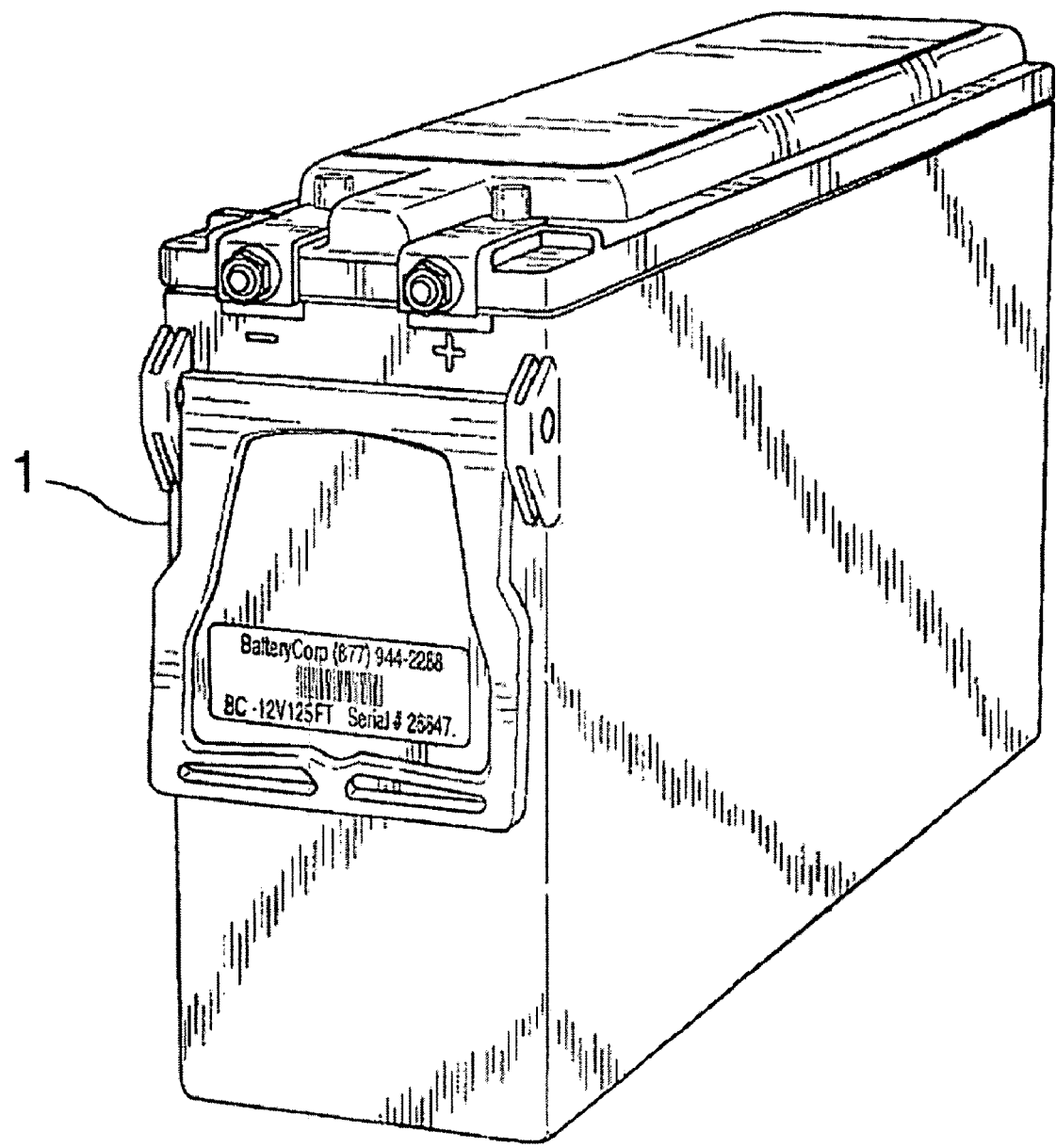
FIG. 1 is a perspective view of a battery unit with a tag associated with the battery.

FIG. 1 shows a battery casing (1) with a label containing a unique identifier. In an alternative embodiment, the label may be comprised of a Mega-Tag. The Mega-Tag is associated with a particular battery unit, so that the unique identification number embedded in the tag is consistently associated with that particular battery. Preferably to assure such continued association, the tag is affixed to the exterior casing of the battery with an adhesive, in the form of an adhesive-backed, non-smudge label.

Figure 2:
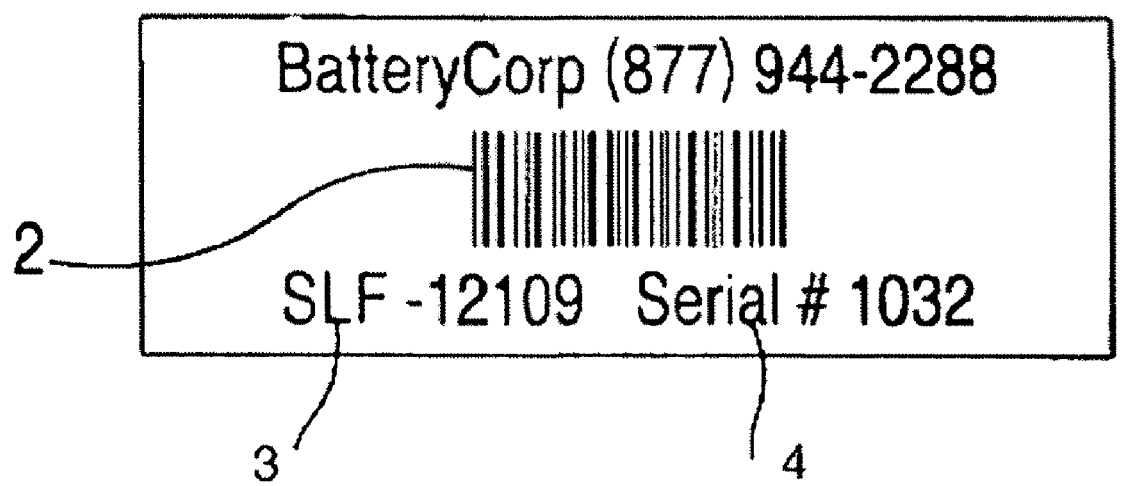
FIG. 2 is a representation of a tag for use with the present invention.

Mega-Tags are preferably bar coded labels that contain a unique identifier for the associated battery. The Mega-Tag shown in FIG. 2 has, preferably, the following information: the service provider name and telephone number; (2) the bar code of a unique identification number; (3) the battery model; and (d) the unique identification number (4) in human readable form. Because of the preferred inclusion of human readable information in conjunction with the bar code identification number, the Mega-Tag is preferably affixed where it can be viewed and scanned by a human operator without dislocating the battery.

The present system may use a testing and data acquisition device to enable reporting and analysis. In a preferred embodiment, the testing device is an ohmic battery tester. The three types of ohmic battery testers that may be used with the present system include impedance testers, conductance testers and resistance testers. Impedance testers, such as the BatteryCorp BC-T2000, shown in FIG. 3, and the Megger BITE3, measure the resistance to the flow of a small (less than one amp) AC current through a battery. Conductance testers, such as the BatteryCorp BC Celltron Ultra and the Midtronics Celltron Ultra, also measure the flow of AC current through a battery but measure the conductance rather than the impedance. Resistance testers, such as the Alber Cellcorder CRT-400, measure the drop in DC voltage by applying a momentary load.

Figure 3:
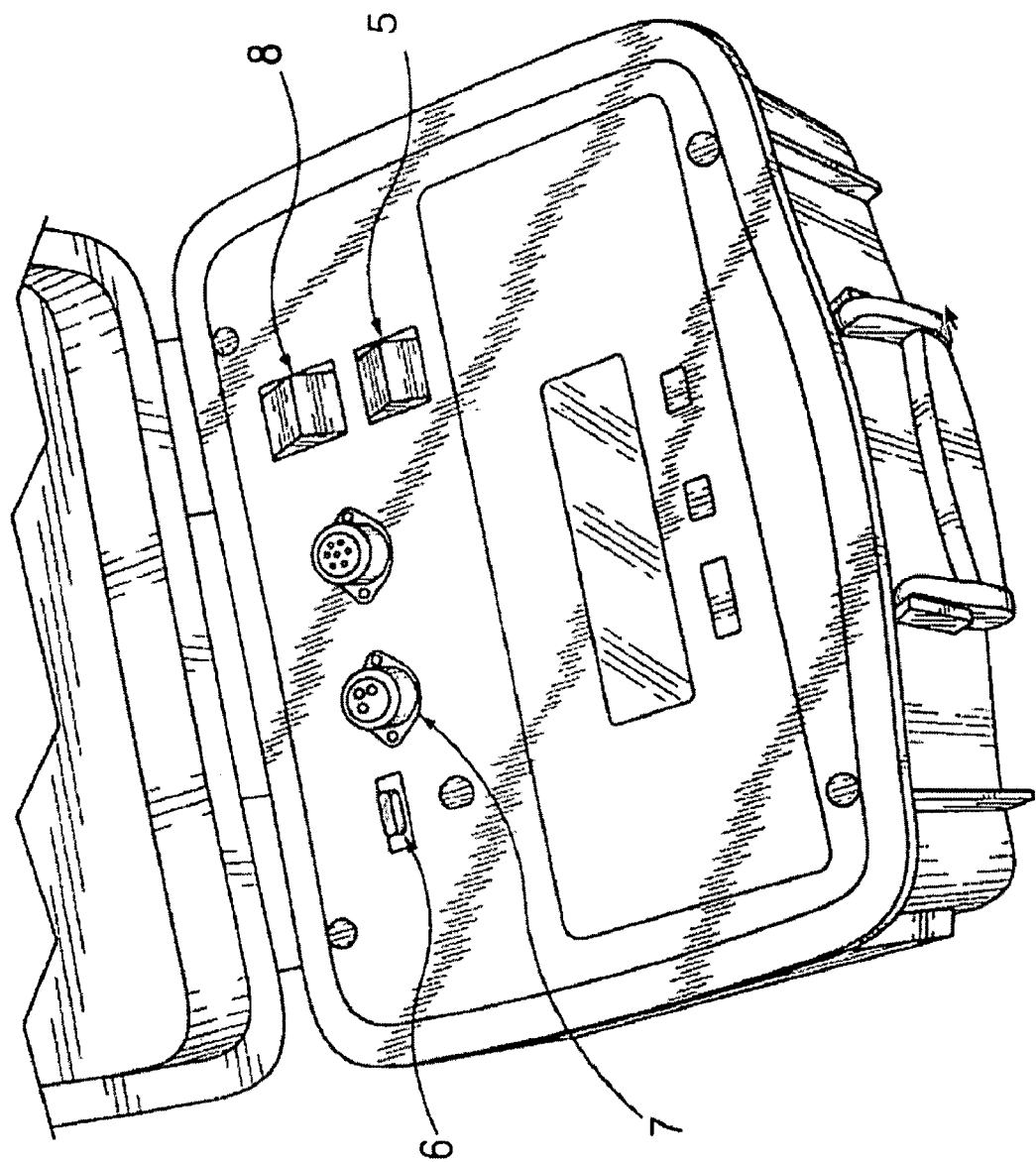
FIG. 3 is a view of a battery testing and data acquisition device for use with the present invention.

Although different testers may be used, such testers should be able to import and export data. In the preferred embodiment, this may be accomplished with a bar code reader. The bar code scanner or reader is preferably in direct communication with the battery testing device for ease of use and reliable interface. This is preferably accomplished by use of a port (6) for a bar code reader and for connection to a computer. Also shown in FIG. 3 are ports for two testing probes (7), an on/off switch (5) and A/C current in port (8). The data files can be in a number of formats, since the invention is a flexible platform with the ability to interface with data files in a number of formats.

In particular, the testing and data acquisition device should be able to store test results in memory, associating each test with the pertinent unique scanned identifier. It should also be able to output the test results in an industry-standard file format, such as ASCII text or Excel XLS. The testing and data acquisition device should be able to perform impedance or conductance or resistance testing (IEEE approved technologies).

In an alternative embodiment, the testing and data acquisition device may operate with an infra-red thermometer, either integrated with the battery tester or otherwise in communication with the tester. The thermometer would read the temperatures of individual batteries, and the temperature associated with the unique identifier for that particular unit. Such a thermometer would provide additional information concerning the subject battery unit that would be read, uploaded and stored. Such a thermometer would obviate the need for a separate thermometer to record ambient temperature surrounding the battery units, which is stored along with the battery test data, and provide a more accurate reading of individual unit temperatures.

The testing device files preferably have the following detail information. First, there is a Unique Identifier that identifies the individual battery unit. Second, the date and time of the test are included in the file. Third, a Location Code is included with the file. This is a code that links the database of the invention, indicating the location of the battery. Fourth, the ambient temperature is stored along with the test information, because battery temperature is correlated with life expectancy. Fifth, the test value, which is the individual battery unit test result, typically either an impedance, conductance or resistance value. It is the key indicator of the battery's health. The greater the impedance or resistance, or the lower the conductance (they are inverse measurements of the same attribute) the poorer the state of health of the battery. Sixth, a strap test value. Strap testing is a test of the interconnection between the current battery itself and the next battery in sequence (in the string). Seventh, a voltage is included, which is the voltage measurement of the battery. Voltage is another indicator for battery health and is also an indicator of the status of the device which is used to charge the battery.

Exemplary Configuration, Operation and Reporting

Figure 4:
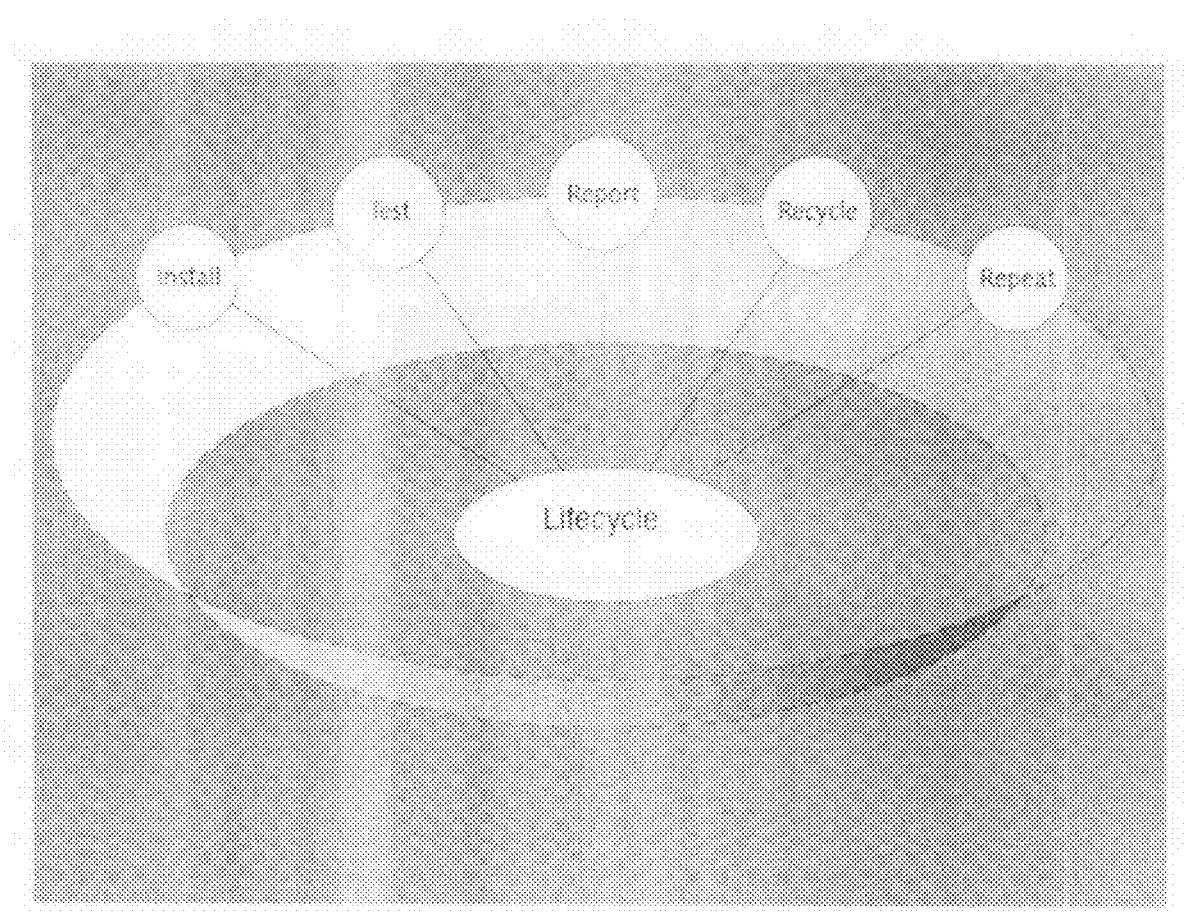
FIG. 4 is a high level diagram of the battery management system.

FIG. 4 provides a high-level overview of the process of the present invention. In accordance with the present invention, the system tracks the lifecycle of a battery. The lifecycle includes five phases: 1) Install 2) Test 3) Report 4) Recycle 5) Repeat.

As mentioned above, batteries are installed with technology to enable automated tracking and runtime analysis. The technology is preferably embodied as a combination of hardware and software components. Preferably, the hardware is comprised of the testing and data acquisition device (mentioned above) and a computer system. In accordance with the present invention, the computer system may include a personal computer web server, database system, input/output (I/O) circuitry, and network connectivity. The software components permit communication between the battery, the testing and data acquisition devices, and computer system. This provides for advanced tracking, monitoring, management and reporting of batteries.

The software design may be object-oriented, offering developers the benefits of full inheritance, encapsulation and polymorphism. This dramatically reduces design, coding, and testing times, producing a highly efficient rapid application development (RAD) environment.

The platform may be developed using a variety of programming tools from Microsoft, Apple, Google and other software vendors. The integrated development environment (IDE) includes productivity boosting features such as automated syntax management, a powerful editor, line-by-line debugging, graphical design tools (including visual classes and subclasses), and integrated database access.

The development methodology may be referred to as business function modeling (BFM). In other words, the entire orientation of the development effort revolves around the business rules and processes. This may also be referred to as an object functional model. Each function encapsulates a particular business task, yet from a development point of view it also inherits any and all system functions necessary to perform the intended task.) For example, a purchase order object would accept the request, access the necessary data, employ all pertinent business rules, validate the posted data, update the database, and generate a response—all within a single software object. This is a major architectural advantage.

Some of the tools that may be used to develop the software include Microsoft Visual FoxPro 7.0 (IDE); Macromedia HomeSite (HTML/JavaScript editor; any can be used); IDAutomation.com (bar code fonts); Adobe Acrobat 5.0; and West Wind Web Connection (Base classes for web services). Web Connect by West Wind Technologies is a framework of base classes for building web applications. These classes perform all low-level functions for authentication, request management, session management, data formatting and output. It may be preferable to use updated versions of the above programs as they become available. Database management is another software component of the present invention. Each battery test data point and a plurality of data elements may be stored along with the unique identifier value associated with the individual battery unit. This enables trend analysis reporting and individual battery detail reporting.

Finally, the software platform may contain a rich set of connectivity tools. Preferably, it can easily import/export data in various formats, from plain text to delimited files to Excel to XML. In fact, the battery tester upload module should accept data in both text and XLS formats. It may also directly access any ODBC compliant data source, such as Oracle, DB2 and other databases. Seamless communication between the main application and any related systems may also be accomplished via XML classes.

After installation, the software may send an automated email notification to the pertinent technician that various locations require battery testing. This process is called Auto Notification. The technician that is informed of the required testing can be either an internal (i.e. employee of the customer company) or an outsourced (third party) technician. This Auto Notification feature is not required for functioning of the present invention, since users may use the software with this feature disabled, and set up their testing schedule separately.

In the internal version of operation, a user may connect the battery testing device to a serial or USB (Universal Serial Bus) port of a computer with a null-modem cable, or other standard computer peripheral device which is readily available. Linking software facilitates the transfer of data from the testing and data acquisition device to a storage medium on the PC. Typically, the user clicks the "Transfer" button displayed on the graphical user interface (GUI) of the software. The response will be "Waiting for data." Prompts on the battery tester will guide the user to the menu option for downloading the data.

The user may then log in to the proprietary service provider website. The user will then click on the Upload Data icon displayed within the GUI. The linking software then uploads the specified data file to a proprietary web server. The web server processes the data file, storing the pertinent data in the appropriate tables of the database.

In the external or outsourced version of operation, a technician may test a battery with the batter tester and upload the data via a network connection, preferably a global computer network such as the Internet, to a database, preferably located on a server. Upon receipt of uploaded data files, the software processes the data and sends an automated report (Auto Report) back to the technician. One report may indicate whether the batteries all "Passed," or if any "Failed" the test. Another report may provide instructions to the technician on whether or not to replace any given battery or all batteries, depending upon the business rules for that customer (Auto Replacement). If Auto Replacement is enabled, software will route the appropriate information to the pertinent installation technician. The software report may also provide recycling data, so that batteries being replaced may be properly recycled.

Data elements stored include:
   a. Unique ID
   b. ID of the user who performed the test
   c. Test date and time
   d. Test type (Impedance or Conductance or Resistance)
   e. Test measurement value
   f. Strap measurement value if applicable
   g. Voltage
   h. Ambient temperature The software may then generate comprehensive reporting and analysis, preferably the following reports:
   a. Battery Test History (detail by location)
   b. Battery Test Summary (overview of tests and results)
   c. Untested Batteries (verification tool)
   d. Battery Installation Aging (based upon installation date)
   e. Performance Status Report (analysis which groups batteries based upon user-defined status criteria for "pass", "fair", "warning" and "fail")
   f. Replacement Forecast (analysis based upon user-defined criteria to estimate costs of upcoming replacements)
   g. Anomaly Report (tracks deviation in parameters including voltage, temperature or ohmic test value which may indicate either equipment fault or invalid/incomplete testing)
   h. Runtime Analysis (runtime reserve by location)
   i. Runtime Replacement (computes replacement requirements in order to meet specific runtime reserve requirements)

As mentioned above, the auto-notification feature may be based upon customer-defined business rules. These rules typically test interval and escalation procedure, automatic battery replacement intervals and escalation procedures. These business rules can be specified by customer-defined business units. Business units might be geographical areas, product line groupings, etc. This provides considerable flexibility for the user in how to utilize the automated notification and reporting processes. Notification and reporting processes are preferably made via email, dynamically generated html pages, or other electronic transmission means.

The runtime analysis module is built on the basic system, with or without options such as replacement or redeployment methodology or other reporting modules such as anomaly reporting. The runtime analysis module provides a report of estimated runtime based on both battery and equipment specifications, and actual state of health compared to current load measurements. The runtime analysis module provides critical information for backup operational planning purposes.

A novel feature of the present invention is the ability to produce a report depending on predicted reserve runtime. The runtime reserve report allows a user to specify how much runtime reserve they require, and output the shows how to achieve it. Generating the output report may be accomplished through an innovative application of algorithms to a predefined set of business rules, statistics and attributes for batteries and available inventory, market data and user input.

As used herein, "runtime" refers to the length of time that a backup system can provide adequate power to keep the primary equipment operational. Therefore it is important to compare the available backup power against the current load requirement, in order to forecast the backup power runtime. The runtime analyzer may automate this important function, both on a detail level and on an aggregate level. Thus, a company can look at backup power availability at individual locations as well as various summary formats by business unit. This facilitates the enforcement of company, industry and/or governmental standards as appropriate.

The runtime analyzer requires as input battery test data and load information by equipment type. The processing steps consist of:

1) User interface prompts the requestor for scope information, such as:
   a) Specify required runtime reserve in hours and minutes
   b) Select a region/market
   c) Option to include equivalent batteries or not
   d) Summary or detail version
   e) Is a generator present? (Y/N)
2) A query is sent to the database
3) Data is processed and algorithms are run
4) Report output is generated Battery discharge curves are utilized to compute the runtime. A battery discharge curve is a technical specification that is routinely provided by battery manufacturers for each of their battery models. It describes the relationship between load and the amount of time that the battery can supply power (amps) at the requisite voltage.

Estimated runtime reserve may be displayed as "specifications" (how much would be available with new batteries based upon the total load) and "current" (how much is available based upon the total load and the current state of health of the batteries).

A sample runtime reserve detailed report is shown in FIG. 5. This preferred mode of reporting includes the following details:
Name of company;
Name of Market/Industry;
Required Runtime Reserve;
Site Name;
Manufacturer;
Part Number:
Quantity;
Price per Part;
Battery Cost;
Extra Strings;
Labor Cost;
Total Cost.

A summary runtime reserve report is shown in FIG. 6. This preferred mode of reporting includes the following details:
Name of company;
Name of Market/Industry;
Required Runtime Reserve;
Manufacturer;
Quantity;
Cost Each;
Extended Amount;
Labor Estimate;
Number of locations that can meet the runtime reserve requirement;
Total Cost;
Number of locations that cannot meet the runtime reserve requirement in their existing configuration.

Any location that meets the requirement will not appear on the report, even if it has failed batteries. Any location where 100% new batteries would not meet the requirement appears on the report. They are, however, displayed with an * asterisk preceding the location designation and do not contain battery or installation cost data.

As shown in FIG. 6, the summary page contains a footnote explaining the number of sites that cannot meet the specification in their existing configuration. Any location that does appear on the report will include replacements as follows: Business rules apply (i.e. any failed batteries will automatically be included) If business rule replacements alone do not provide adequate runtime, then additional battery jars are marked for replacement until the new configuration will supply adequate power for the runtime specification. String replacement rules are not applied here. For example, if any given percentage of a string is replaced in order to meet the specification, and that percentage exceeds the threshold in which to replace the entire string for state-of-health reasons, the software will not replace the entire string in this analysis.

Since other modifications or changes will be apparent to those skilled in the art, there have been described above the principles of this invention in connection with specific apparatus, it is to be clearly understood that this description is made only by way of example and not as a limitation to the scope of the invention.

What is claimed is:

1. A battery managing and reporting method comprising the steps of:
   creating a unique identifier for a battery, the battery having a plurality of attributes;
   acquiring test results from the battery;
   the test results comprising a set of battery values associated with the battery;
   storing the test results from the battery in a database;
   storing a set of battery specifications for a plurality of battery types in the database;
   generating a set of business rules, the set of business rules comprising a set of baseline values for the plurality of attributes associated with the battery;
   specifying a runtime reserve requirement;
   querying the database for a result set, the result set including the test results and the set of battery specifications;
   applying the business rules and the specified runtime reserve requirement to the result set;
   generating a runtime reserve report, the report being stored on a computer readable medium.

2. The battery managing and reporting method of claim 1, further comprising the step of examining each battery for physical indicia of damage.

3. The battery managing and reporting method of claim 1, wherein the plurality of attributes of the battery comprises an age value, an impedance value, and a conductance value.

4. The battery managing and reporting method of claim 3, wherein the baseline value of the age attribute is within a range of about 24 to about 48 months.

5. The battery managing and reporting method of claim 1, further comprising the step of compiling the test results for a plurality of batteries and generating a runtime reserve report based on an estimation of battery life left in the plurality of batteries combined.

6. The battery managing and reporting method of claim 1, wherein the business rules further comprise a schedule for generating an automated runtime reserve report at the end of a period.

7. The battery managing and reporting method of claim 6, wherein the period is 12 months.

8. The battery managing and reporting method of claim 1, wherein the step of generating a runtime reserve report further comprises the step of: generating a list of components that can support the specified runtime reserve requirement.

9. The battery managing and reporting method of claim 1, wherein the runtime reserve report comprises recycling instructions.

10. A battery managing and reporting method comprising the steps of:

creating a unique identifier for a battery, the battery having a plurality of attributes;

acquiring test results from the battery;

the test results comprising a set of battery values associated with the battery;

storing the test results from the battery in a database;

storing a set of battery specifications for a plurality of battery types in the database;

generating a set of business rules, the set of business rules comprising a set of baseline values for the plurality of attributes associated with the battery;

prompting for a runtime reserve requirement via a user interface;

receiving the runtime reserve requirement as an input parameter;

querying the database for a result set, the result set including the test results and the set of battery specifications;

applying the business rules and the input parameter to the result set;

generating a runtime reserve report, the report being stored on a computer readable medium.

11. A battery managing and reporting method comprising the steps of:

creating a unique identifier for a battery, the battery having a plurality of attributes;

acquiring test results from the battery;

the test results comprising a set of battery values associated with the battery;

storing the test results from the battery in a database;

storing a set of battery specifications for a plurality of battery types in the database;

generating a set of business rules, the set of business rules comprising a set of baseline values for the plurality of attributes associated with the battery;

prompting for a runtime reserve requirement and a geographic region via a user interface;

receiving the runtime reserve requirement and the geographic region as a set of input parameters;

querying the database for a result set, the result set including the test results and the set of battery specifications;

applying the business rules and the set of input parameters to the result set;

generating a runtime reserve report, the report being stored on a computer readable medium.

* * * * *